United States Patent
Seitz et al.

(10) Patent No.: US 6,759,292 B2
(45) Date of Patent: Jul. 6, 2004

(54) METHOD FOR FABRICATING A TRENCH CAPACITOR

(75) Inventors: Mihel Seitz, Dresden (DE); Michael P. Chudzik, Beacon, NY (US); Jack A. Mandelman, Flat Rock, NC (US)

(73) Assignees: Infineon Technologies AG (DE); International Business Machines Corporation, Armonk, NY (US)

(*) Notice: Subject to any disclaimer, the term of this patent is extended or adjusted under 35 U.S.C. 154(b) by 0 days.

(21) Appl. No.: 10/283,483

(22) Filed: Oct. 30, 2002

(65) Prior Publication Data

US 2004/0084708 A1 May 6, 2004

(51) Int. Cl.[7] .................. H01L 21/8242; H01L 21/20
(52) U.S. Cl. ........................ 438/243; 438/386
(58) Field of Search ........................ 438/243–249, 438/386–395, 438, 254; 257/301, E27.092, E27.095, E29.346, 302, 303, E21.396, E21.651

(56) References Cited

U.S. PATENT DOCUMENTS

| | | | |
|---|---|---|---|
| 5,482,883 A | * | 1/1996 | Rajeevakumar ............ 438/249 |
| 6,518,616 B2 | * | 2/2003 | Kudelka et al. ............ 257/301 |
| 6,599,798 B2 | * | 7/2003 | Tews et al. ................ 438/249 |
| 6,605,838 B1 | * | 8/2003 | Mandelman et al. ....... 257/305 |

* cited by examiner

Primary Examiner—George Fourson
Assistant Examiner—Brook Kebede
(74) Attorney, Agent, or Firm—Lerner, David, Littenberg, Krumholz & Mentlik, LLP

(57) ABSTRACT

A memory cell includes: a trench capacitor, including a trench silicon layer having an upper portion and a lower portion, and a buried plate disposed adjacent the lower portion of the trench silicon layer; an array FET having a gate portion, a drain portion, a source portion, and a buried strap coupled to one of the source and drain portions, the buried strap being in communication with the upper portion of the trench silicon layer; and a collar disposed about the upper portion of the trench silicon layer and between the buried strap and the buried plate, the collar including a re-entrant bend that is operable to decrease an electric field between the buried strap and the buried plate.

17 Claims, 5 Drawing Sheets

METHOD FOR FABRICATING A TRENCH CAPACITOR

BACKGROUND OF THE INVENTION

The present invention relates to a memory cell, and methods of forming same, where the memory cell includes a trench capacitor, an array FET, and a collar.

Memory arrays, such as dynamic random access memories (DRAMs), employ memory cell structures, where each memory cell stores one bit of information. A typical storage cell includes a single array transistor, e.g., a field effect transistor (FET), and a capacitor coupled from one of the source and drain of the FET to ground. The gate of the FET is connected to a word line and the other of the drain and source of the FET is connected to a bit line.

While the physical layout of a conventional memory cell may take on many forms, a popular configuration includes a trench capacitor and vertically aligned FET. An example of such a conventional structure of a memory cell 10 is illustrated in FIG. 1. The memory cell 10 includes a trench capacitor 14 and a vertically aligned FET 16. The trench capacitor 14 includes a polysilicon layer 18 and a buried plate 20 at a lower portion of the layer 18. The FET 16 includes a gate portion 22, a source portion 24, a drain portion 26, and a channel 28. The drain portion 26 may include a buried strap coupled to an upper portion of the polysilicon layer 18 of the trench capacitor 14. A collar 30 is disposed about the upper portion of the polysilicon layer 18.

Although the structure of the memory cell 10 of FIG. 1 is widely used in so-called trench capacitor design, it suffers from a significant disadvantage. In particular, a parasitic transistor is inherent in the memory cell 10 between the buried strap 26 and the buried plate 20. This parasitic transistor permits a significant electric field between the buried strap 26 and the buried plate 20, which also permits undesirable leakage along the trench from the buried plate 20 to the buried strap 26. Unfortunately, this undesirably affects the storage capabilities of the memory cell 10, including significantly reducing any charge stored on the trench capacitor 14.

Accordingly, there are needs in the art for new memory cell configurations, and methods of making same, which significantly reduce or eliminate the parasitic transistor between a buried strap and a buried plate in a trench capacitor storage cell, thereby significantly reducing any leakage between the buried plate and the buried strap.

SUMMARY OF THE INVENTION

In accordance with one or more aspects of the present invention, a memory cell includes a trench capacitor, including a trench silicon layer having an upper portion and a lower portion, and a buried plate disposed adjacent the lower portion of the trench silicon layer; an array FET having a gate portion, a drain portion, a source portion, and a buried strap coupled to one of the source and drain portions, the buried strap being in communication with the upper portion of the trench silicon layer; and a collar disposed about the upper portion of the trench silicon layer and between the buried strap and the buried plate, the collar including a re-entrant bend that is operable to decrease an electric field between the buried strap and the buried plate.

Preferably, the re-entrant bend of the collar includes a substantially sharp distal edge. Further, it is preferred that the re-entrant bend of the collar is between about 200–300 nm in length. The collar is preferably formed of an oxide.

It is noted that the array FET may be vertically oriented or horizontally oriented.

In accordance with one or more further aspects of the present invention, a method of forming a memory cell includes etching a trench having an upper portion and a lower portion into a substrate; diffusing a dopant into the substrate proximate to the lower portion of the trench to form a buried plate; etching the trench in an area substantially at an upper portion of the buried plate to form a re-entrant bend in a sidewall of the trench; and forming a collar on the sidewall of the trench that includes the re-entrant bend and at least a portion of the upper portion of the trench.

Preferably, step of forming the re-entrant bend includes using $NH_4OH/HF$ etching cycles such that oxide consumption is less than about 60 angstroms. Preferably, the re-entrant bend of the collar includes a substantially sharp distal edge.

The method may further include forming a sacrificial collar on the upper portion of the trench that extends down to a lower edge prior to forming the buried plate; forming an oxide in the trench after forming the buried plate that is proximate to the buried plate and extends up the trench to an upper edge; filling the trench with resist to a level below the upper edge of the oxide; and removing a portion of the oxide from the trench that extends from the resist to the upper edge to form an exposed portion of the sidewall of the trench.

It is preferred that the exposed portion of the sidewall is between about 200–300 nm in length. The sacrificial collar may be formed from one of nitride and a polysilicon. Preferably, the step of forming a re-entrant bend in the sidewall of the trench includes etching the trench in the exposed area of the sidewall between the oxide and the sacrificial collar.

The method may further include forming a trench capacitor by filling at least a portion of the trench with a silicon layer having an upper portion and a lower portion; and forming an array FET having a gate portion, a drain portion, a source portion, and a buried strap coupled to one of the source and drain portions, wherein the buried strap is in communication with the upper portion of the trench silicon layer and the collar is between the buried strap and the buried plate such that the re-entrant bend thereof is operable to decrease an electric field between the buried strap and the buried plate. The silicon layer of the trench capacitor may be formed of polysilicon.

In accordance with one or more further aspects of the present invention, a method of forming a memory cell includes etching a trench having an upper portion and a lower portion into a substrate; forming a sacrificial collar on the upper portion of the trench that extends down to a lower edge; diffusing a dopant into the substrate proximate to the lower portion of the trench to form a buried plate; forming an oxide in the trench that is proximate to the buried plate and extends up the trench to an upper edge; filling the trench with resist to a level below the upper edge of the oxide; removing a portion of the oxide from the trench that extends from the resist to the upper edge; removing the resist from the trench; etching the trench in the area between the lower edge of the sacrificial collar and the oxide to form a re-entrant bend in a sidewall of the trench; forming a collar on the sidewall of the trench that includes the re-entrant bend and at least a portion of the upper portion of the trench; filling at least a portion of the trench with a silicon layer having an upper portion and a lower portion; and forming an array FET having a gate portion, a drain portion, a source portion, and a buried strap coupled to one of the source and drain portions, wherein the buried strap is in communication with the upper portion of the trench silicon layer and the collar is between the buried strap and the buried plate such that the re-entrant bend thereof is operable to decrease an electric field between the buried strap and the buried plate.

Other aspects, features, advantages, etc. will become apparent to one skilled in the art in view of the description herein taken in conjunction with the accompanying drawings.

BRIEF DESCRIPTION OF THE DRAWINGS

For the purposes of illustrating the invention, there are shown in the drawings forms that are presently preferred, it being understood, however, that the invention is not limited to the precise arrangements and/or instrumentalities shown.

DETAILED DESCRIPTION

Figure 1:
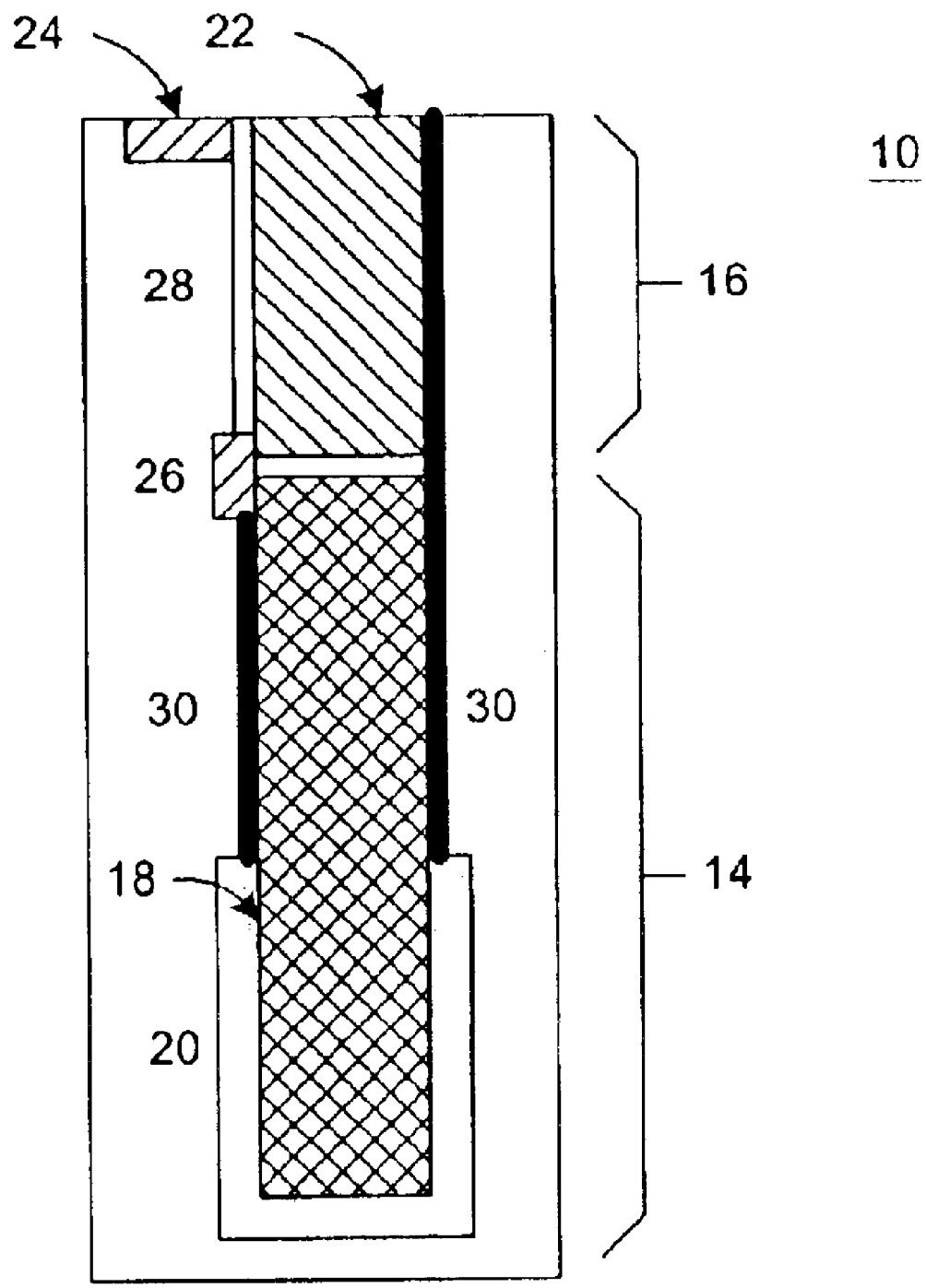
FIG. 1 is a schematic cross-sectional view of a memory cell in accordance with the prior art.
Figure 2:
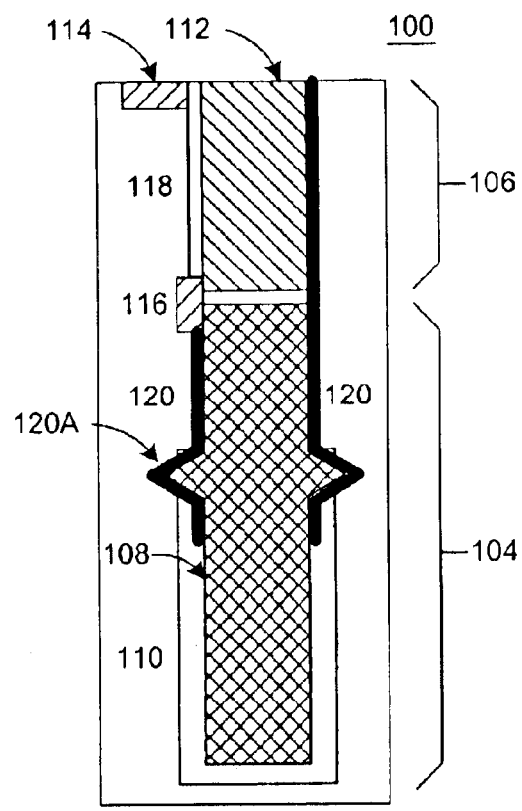
FIG. 2 is a schematic cross-sectional view of a memory cell in accordance with one or more aspects of the present invention.

With reference to the drawings, wherein like numerals indicate like elements, there is shown in FIG. 2 a cross-sectional view of a memory cell 100 in accordance with one or more aspects of the present invention. The memory cell 100 includes a trench capacitor 104 and an array FET 106, disposed in a vertical orientation. The trench capacitor 104 includes a trench silicon layer 108 having an upper portion and a lower portion. The trench silicon layer 108 is preferably formed from a polysilicon material. The trench capacitor 104 preferably further includes a buried plate 110 disposed about the lower portion of the trench silicon layer 108.

The array FET 106 preferably includes a gate portion 112, a source portion 114, a drain portion 116, and a channel 118. The drain portion 116 preferably includes a buried strap that is in communication with the upper portion of the trench silicon layer 108. It is noted that the vertically oriented array FET 106 is illustrated and described herein by way of example and not by way of limitation. Indeed, as discussed hereinbelow, a planar (horizontally oriented) array FET may also be employed without departing from the spirit and scope of the invention. Further, while a single sided buried strap is illustrated for discussion purposes, any of the known buried strap configurations may be employed without departing from the invention.

The memory cell 100 preferably further includes a collar 120 disposed about at least the upper portion of the trench silicon layer 108 and between the buried strap 116 and the buried plate 110. The collar 120 preferably includes a re-entrant bend 120A that is operable to decrease an electric field between the buried strap 116 and the buried plate 110. Preferably, the re-entrant bend 120A of the collar 120 includes a substantially sharp distal edge that is radially spaced away from sidewalls of the trench silicon layer 108. It is most preferred that the re-entrant bend 120A has an overall length (as opposed to a path length) of between about 200–300 nm. As used herein, the overall length of the re-entrant bend 120A is preferably measured in a substantially straight line from top to bottom as seen in the figures. The path length of the re-entrant bend 120A is preferably measured along the path of the bend from top to bottom. Using these definitions, the path length of the re-entrant bend 120A would be longer than the overall length thereof. Preferably, the collar 120 is formed from an oxide, such as silicon dioxide.

Figure 3:
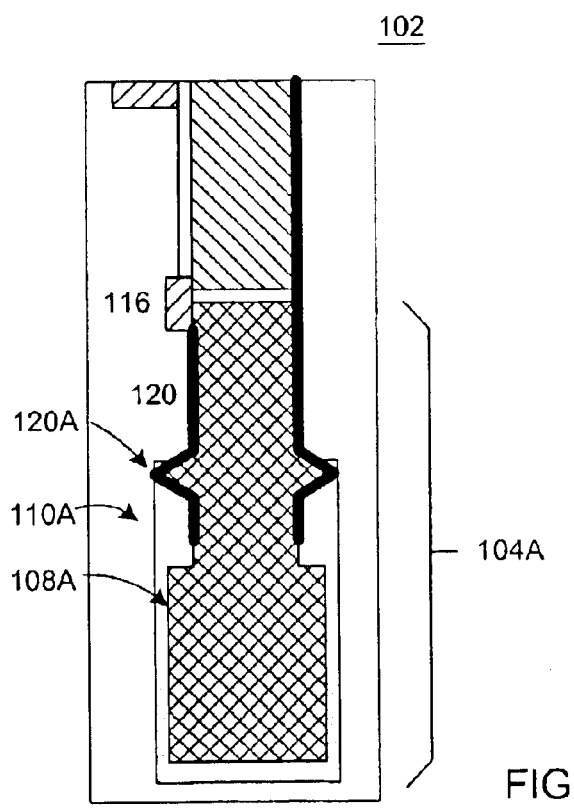
FIG. 3 is a schematic cross-sectional view of an alternative configuration of a memory cell employing one or more aspects of the present invention.

With reference to FIG. 3, the collar 120, including the re-entrant bend 120A, may be employed in an alternative memory cell structure 102 having a bottle-etched trench capacitor 104A. The re-entrant bend 120A is preferably disposed between the buried strap 116 and the buried plate 110A such that any electric field between the buried strap 116 and the buried plate 110A is reduced.

Advantageously, the re-entrant bend 120A of the collar 120, in accordance with the present invention, reduces the electric field between the buried strap 116 and the buried plate 110, thereby reducing and/or eliminating the parasitic transistor between the buried strap 116 and the buried plate 110. Further, leakage from the buried plate 110 to the buried strap 116 is significantly reduced, thereby improving the storage characteristics of the trench capacitor 104. A further advantage is obtained in that a thickness of the collar 120 may be significantly reduced, therefore allowing a larger opening and a corresponding larger trench silicon layer 108, which results in a lower series resistance.

With reference to FIGS. 4A–K, a method for forming the memory cell 100 (or 102) of the present invention will now be described. More particularly, with reference to FIG. 4A, a trench 200 is etched into a substrate 102, such as a P-type silicon substrate. A sacrificial collar 202 is preferably formed on an upper portion of the trench 200, which sacrificial collar 200 preferably extends down to a lower edge 202A. The sacrificial collar 202A may be formed utilizing any of the known techniques, such as by forming a nitride, or utilizing a polysilicon material.

The buried plate 110 is preferably formed by diffusing a dopant into the substrate 102 proximate to the lower portion of the trench 200. For example, an N-type dopant may be diffused into the P-type substrate 102 to form the buried plate 110. (It is noted that, if a bottle-etched trench capacitor 104A is desired, a bottle-etch process would be performed prior to diffusing the dopant into the substrate 102.)

Figure 4A:
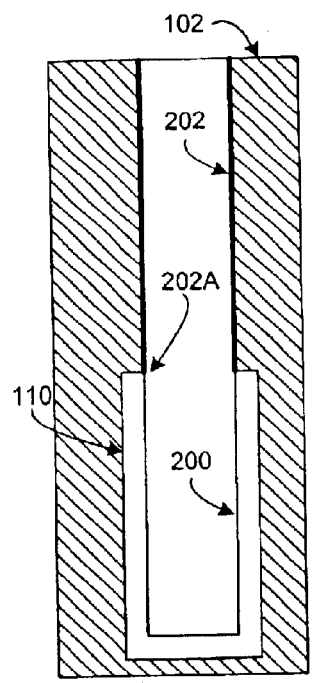
FIGS. 4A–K are schematic cross-sectional views illustrating a process of making a memory cell in accordance with one or more aspects of the present invention.
Figure 4B:
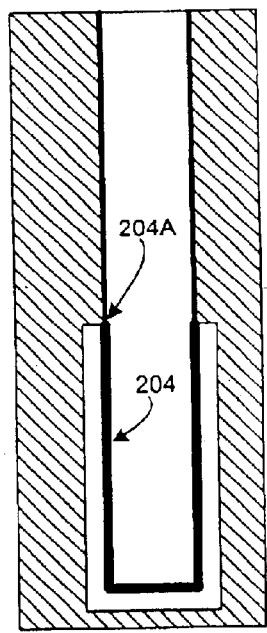

With reference to FIG. 4B, an oxide 204 is preferably formed in the trench 200 proximate to the buried plate 110. The oxide 204 may be formed utilizing any of the known techniques, such as a dry, rapid thermal oxidation (RTO) process. It is preferred that the oxide 204 is approximately sixty angstroms thick. As illustrated, the oxide 204 preferably extends up the trench 200 to an upper edge 204A. It is most preferred that the upper edge 204A of the oxide 204 extends to the lower edge 202A of the sacrificial collar 202.

Figure 4C:
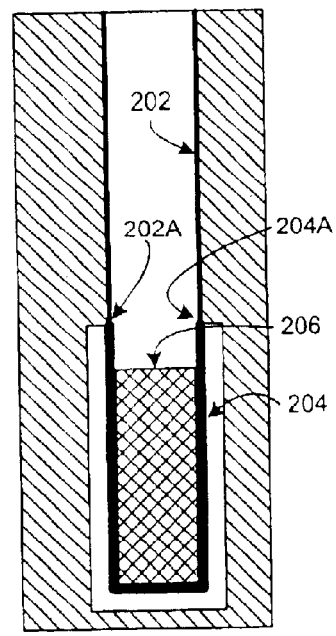

With reference to FIG. 4C, the trench 200 is preferably filled with resist 206 to a level below the upper edge 204A of the oxide 204. This may be achieved utilizing any of the known techniques, such as filling the trench 200 entirely with the resist 206, and then recessing the resist 206 to the desired level. It is most preferred that the level of the resist 206 is between about 200–300 nm below the upper edge 204A of the oxide 204. Looking at it from another perspective, the level of the resist 206 is preferably 200–300 nm below the lower edge 202A of the sacrificial collar 202.

Figure 4D:
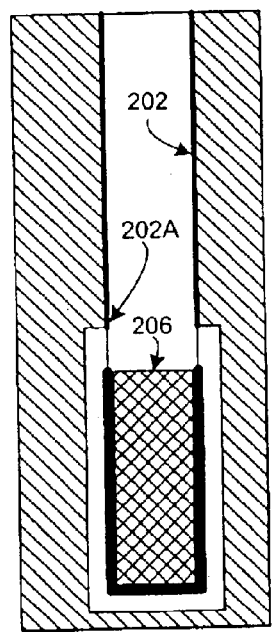

With reference to FIG. 4D, a portion of the oxide 204 is preferably removed from the trench 200. More particularly, the portion of the oxide 204 that extends from the resist 206 to the upper edge 204A of the oxide 204 (or the lower edge 202A of the sacrificial collar 202) is preferably removed.

Figure 4E:
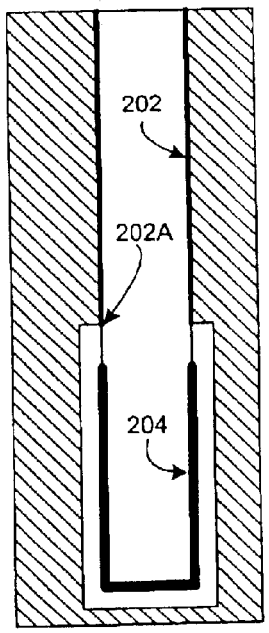
Figure 4F:
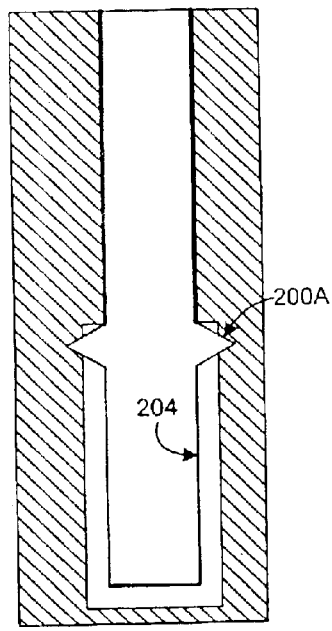

As best seen in FIG. 4E, the resist 206 is preferably removed from the trench 202 utilizing any of the known techniques. Thereafter, the trench 200 is preferably etched in the area in which the oxide 204 was removed, namely, in the area between the lower edge 202A of the sacrificial collar 202 and the oxide 204 (FIG. 4F). Preferably, this etching process produces a re-entrant bend 200A in the sidewall of the trench 200. While any of the appropriate etching processes may be employed, it is preferred that a number of cycles of targeted silicon etching utilizing a $NH_4OH/HF$ process is used. This advantageously etches the trench 200 to form the re-entrant bend 200A in such a way that the consumption of the oxide 204 is less than about sixty angstroms.

Figure 4G:
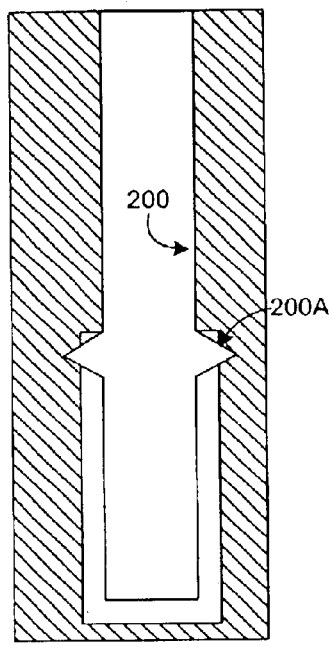

With reference to FIG. 4G, the sacrificial collar 202 is preferably removed, for example, utilizing an HF/EG process.

Figure 4H:
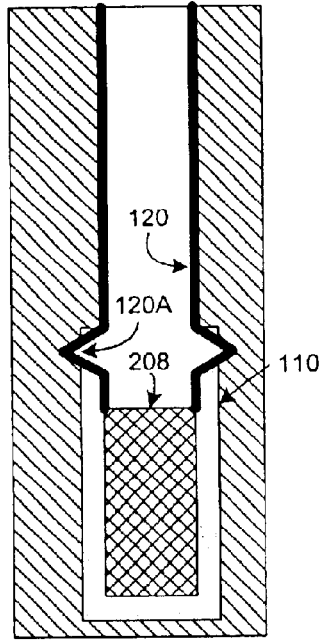

With reference to FIG. 4H, a re-oxidation process is performed, at least in the lower portion of the trench 200 (e.g., proximate to the buried plate 110.) A layer of silicon 208 is preferably formed in the trench 200 to a level below the re-entrant bend 200A. Although any of the known techniques may be utilized to achieve this result, it is preferred that the silicon layer 208 is formed by completely filling the trench 200 and then recessing the level of the silicon layer 208 to the desired level. Although any of the suitable silicon materials may be employed, an arsenic doped polysilicon material is preferred. A polysilicon divot fill sequence may then be performed. Next, a collar 120 is preferably formed on the sidewall of the trench 200, which collar 120 preferably covers the re-entrant bend 200A (FIG. 4G) and at least a portion of the upper portion of the trench 200.

Figure 4I:
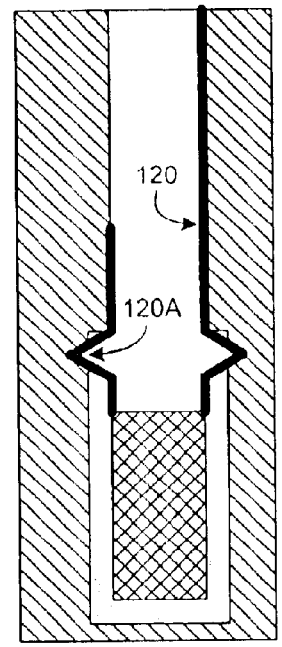
Figure 4J:
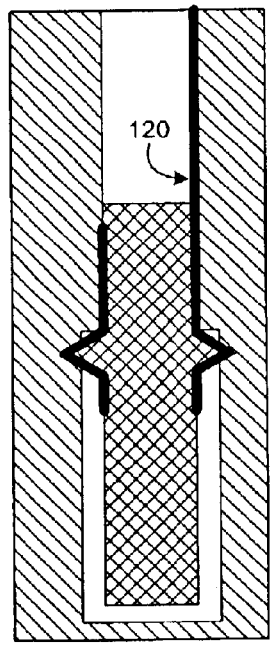
Figure 4K:
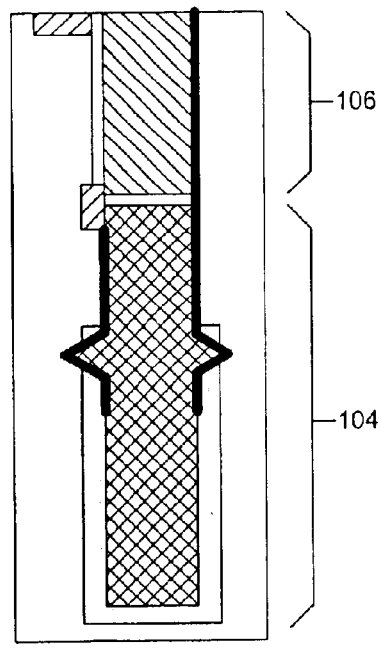

As best seen in FIGS. 4I–K, the collar 120 is preferably etched, and the array transistor 106 is preferably disposed in a vertical orientation above the trench capacitor 104. As discussed above, the re-entrant bend 120A of the collar 120 is advantageously disposed between the buried strap 116 and the buried plate 110.

Figure 5:
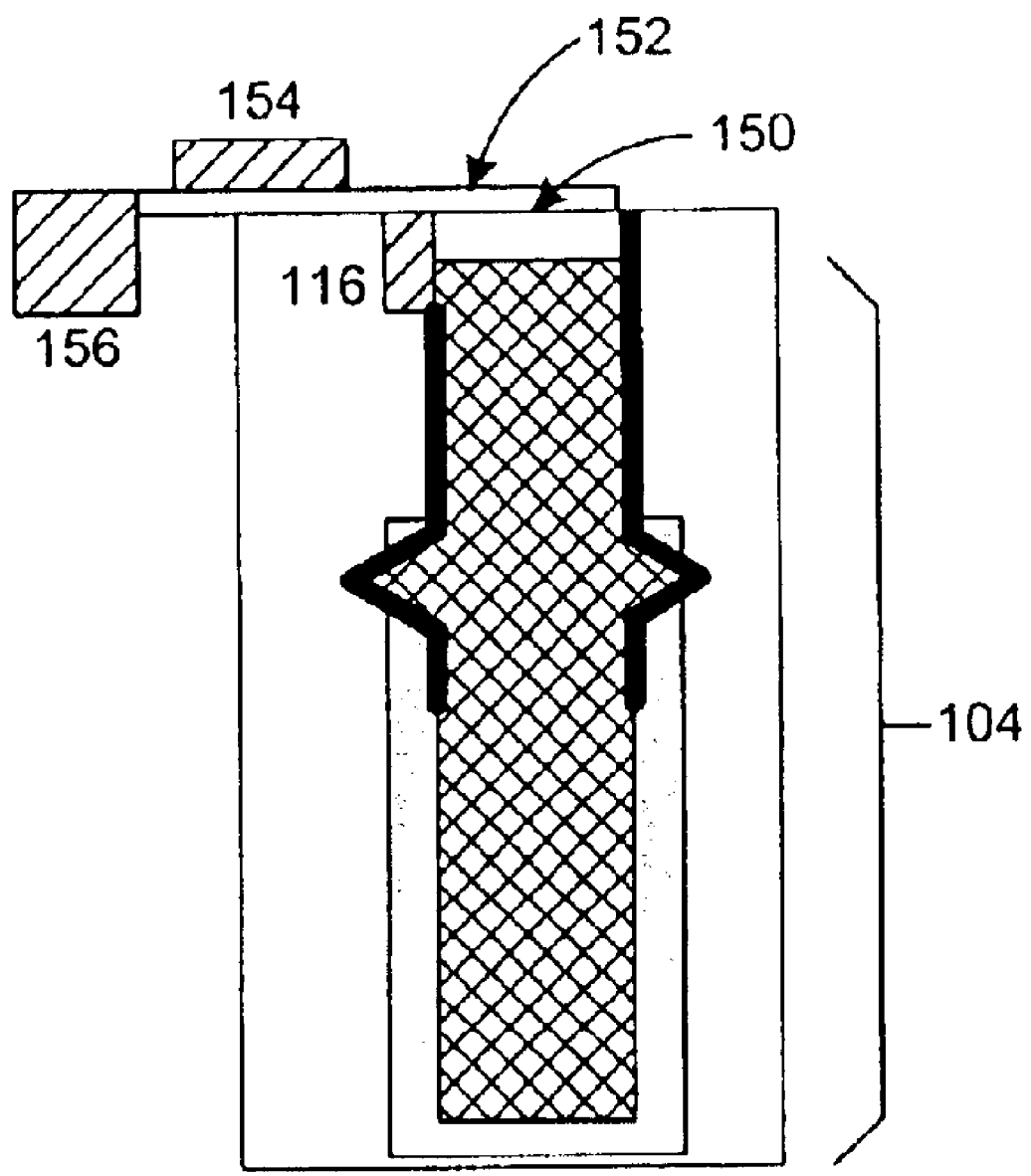
FIG. 5 is a schematic cross-sectional view of a further alternative configuration of a memory cell employing one or more aspects of the present invention.

As discussed above, the array FET 106 may be disposed in other orientations, such as in a planar (horizontal) orientation. As best seen in FIG. 5, the array FET may include a top oxide 150 disposed above the silicon layer 208 and adjacent to the buried strap 116. A gate oxide 152 is disposed above the oxide 150, which gate oxide 152 is disposed above the gate oxide 152 and is preferably formed from poly n-doped material. A source 156 (or drain) is disposed opposite to the buried strap and completes the major portions of the planar array FET.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of forming a memory cell, comprising:

etching a trench having an upper portion and a lower portion into a substrate;

diffusing a dopant into the substrate proximate to the lower portion of the trench to form a buried plate;

etching the trench in an area substantially at an upper portion of the buried plate to form a re-entrant bend in a sidewall of the trench; and forming a collar on the sidewall of the trench that includes the re-entrant bend and at least a portion of the upper portion of the trench.

2. The method of claim 1, wherein the step of forming the re-entrant bend includes using $NH_4OH/HF$ etching cycles such that oxide consumption is less than about 60 angstroms.

3. The method of claim 1, wherein the re-entrant bend of the collar includes a substantially sharp distal edge.

4. The method of claim 3, wherein the collar is formed of an oxide.

5. The method of claim 1, further comprising:

forming a sacrificial collar on the upper portion of the trench that extends down to a lower edge prior to forming the buried plate;

forming an oxide in the trench after forming the buried plate that is proximate to the buried plate and extends up the trench to an upper edge;

filling the trench with resist to a level below the upper edge of the oxide; and removing a portion of the oxide from the trench that extends from the resist to the upper edge to form an exposed portion of the sidewall of the trench.

6. The method of claim 5, wherein the exposed portion of the sidewall is between about 200–300 nm in length.

7. The method of claim 5, wherein the sacrificial collar is formed from one of nitride and polysilicon.

8. The method of claim 5, wherein the step of forming a re-entrant bend in the sidewall of the trench includes etching the trench in the exposed area of the sidewall between the oxide and the sacrificial collar.

9. The method of claim 5, further comprising:

forming a trench capacitor by filling at least a portion of the trench with a silicon layer having an upper portion and a lower portion; and forming an array FET having a gate portion, a drain portion, a source portion, and a buried strap coupled to one of the source and drain portions, wherein the buried strap is in communication with the upper portion of the trench silicon layer and the collar is between the buried strap and the buried plate such that the re-entrant bend thereof is operable to decrease an electric field between the buried strap and the buried plate.

10. The method of claim 9, wherein the silicon layer of the trench capacitor is formed of polysilicon.

11. A method of forming a memory cell, comprising:

etching a trench having an upper portion and a lower portion into a substrate;

forming a sacrificial collar on the upper portion of the trench that extends down to a lower edge;

diffusing a dopant into the substrate proximate to the lower portion of the trench to form a buried plate;

forming an oxide in the trench that is proximate to the buried plate and extends up the trench to an upper edge;

filling the trench with resist to a level below the upper edge of the oxide;

removing a portion of the oxide from the trench that extends from the resist to the upper edge;

removing the resist from the trench;

etching the trench in the area between the lower edge of the sacrificial collar and the oxide to form a re-entrant bend in a sidewall of the trench;

forming a collar on the sidewall of the trench that includes the re-entrant bend and at least a portion of the upper portion of the trench;

filling at least a portion of the trench with a silicon layer having an upper portion and a lower portion; and forming an array FET having a gate portion, a drain portion, a source portion, and a buried strap coupled to one of the source and drain portions, wherein the buried strap is in communication with the upper portion of the trench silicon layer and the collar is between the buried strap and the buried plate such that the re-entrant bend thereof is operable to decrease an electric field between the buried strap and the buried plate.

12. The method of claim 11, wherein the step of forming the re-entrant bend includes using $NH_4OH/HF$ etching cycles such that oxide consumption is less than about 60 angstroms.

13. The method of claim 11, wherein the re-entrant bend of the collar includes a substantially sharp distal edge.

14. The method of claim 11, wherein the re-entrant bend of the collar is between about 200–300 nm in length.

15. The method of claim 11, wherein the collar is formed of an oxide.

16. The method of claim 11, wherein the sacrificial collar is formed from one of nitride and polysilicon.

17. The method of claim 11, wherein the silicon layer of the trench capacitor is formed of polysilicon.

* * * * *